(12) United States Patent
Dun et al.

(10) Patent No.: US 10,636,505 B2
(45) Date of Patent: Apr. 28, 2020

(54) DISPLAY PANEL AND DISPLAY DEVICE

(71) Applicant: Shanghai AVIC Optoelectronics Co., Ltd., Shanghai (CN)

(72) Inventors: Dongliang Dun, Shanghai (CN); Huijun Jin, Shanghai (CN); Tinghai Wang, Shanghai (CN); Zhiqiang Xia, Shanghai (CN); Feng Qin, Shanghai (CN)

(73) Assignee: SHANGHAI AVIC OPTOELECTRONICS CO., LTD., Shanghai (CN)

( * ) Notice: Subject to any disclaimer, the term of this patent is extended or adjusted under 35 U.S.C. 154(b) by 86 days.

(21) Appl. No.: 16/106,689

(22) Filed: Aug. 21, 2018

(65) Prior Publication Data
US 2019/0304558 A1  Oct. 3, 2019

(30) Foreign Application Priority Data
Mar. 27, 2018 (CN) .......................... 2018 1 0259777

(51) Int. Cl.
*H01L 27/12* (2006.01)
*G11C 19/28* (2006.01)
(Continued)

(52) U.S. Cl.
CPC .......... *G11C 19/287* (2013.01); *G02F 1/1368* (2013.01); *G02F 1/136286* (2013.01); *G09G 3/3648* (2013.01); *H01L 27/124* (2013.01); *H01L 27/1225* (2013.01); *G09G 2310/0286* (2013.01)

(58) Field of Classification Search
CPC ............... G11C 19/287; G09G 3/3648; G09G 2310/0286; H01L 27/124; H01L 27/1225; G02F 1/1368; G02F 1/136286
See application file for complete search history.

(56) References Cited

U.S. PATENT DOCUMENTS

2017/0219895 A1* 8/2017 Yu ........................ G09G 3/3677
2018/0090091 A1* 3/2018 Sim ..................... G09G 3/3688
(Continued)

FOREIGN PATENT DOCUMENTS

CN          101779227 A       7/2010

*Primary Examiner* — Kent W Chang
*Assistant Examiner* — Andrew Lee
(74) *Attorney, Agent, or Firm* — Anova Law Group PLLC

(57) ABSTRACT

A display panel includes a display area, a non-display area surrounding the display area, and a plurality of signal lines, signal connection lines, and cascaded shift registers aligned in the non-display area. The display area includes a curved corner, and the non-display area includes a corner non-display area adjacent to the curved corner. The cascaded shift registers are electrically connected by associated cascade lines, and each cascaded shift register is connected with a corresponding signal line through an associated signal connection line. The associated cascade lines are located on a side of the cascaded shift registers away from the display area, and the signal lines are located on a side of the associated cascade lines away from the cascaded shift registers. The wiring directions of the signal lines and the extension lines of the associated cascade lines are in parallel with an outer edge of the non-display area.

14 Claims, 8 Drawing Sheets

(51) Int. Cl.
*G02F 1/1362* (2006.01)
*G02F 1/1368* (2006.01)
*G09G 3/36* (2006.01)

(56) References Cited

U.S. PATENT DOCUMENTS

| | | |
|---|---|---|
| 2018/0166018 A1* | 6/2018 | Yang ........................ H01L 27/32 |
| 2018/0356668 A1* | 12/2018 | Koide .................. G02F 1/13452 |
| 2019/0012974 A1* | 1/2019 | Miyanaga ............ G02F 1/13306 |
| 2019/0043414 A1* | 2/2019 | Wu ....................... G09G 3/2092 |

* cited by examiner

DISPLAY PANEL AND DISPLAY DEVICE

CROSS-REFERENCES TO RELATED APPLICATIONS

This application claims the priority of Chinese Patent Application No. 201810259777.8, filed on Mar. 27, 2018, the entire content of which is incorporated herein by reference.

FIELD OF THE DISCLOSURE

The present disclosure generally relates to the field of display technology and, more particularly, relates to a display panel and a display device thereof.

BACKGROUND

In the existing display device technology, the display panel mainly includes two mainstream technologies: a liquid crystal display panel and an organic self-luminous display panel. Among the twos mainstream technologies, the liquid crystal display panel forms an electric field capable of controlling the deflection of the liquid crystal molecules by applying a voltage across the liquid crystal molecules, thereby controlling the transmission of the light to achieve the display function of the display panel. The organic self-luminous display panel uses an organic electroluminescent material. When a current passes through the organic electroluminescent material, the electroluminescent material emits light, thereby achieving the display function of the display panel.

With the development of technology, the design of electronic display devices constantly pursues a smooth user experience. At the same time, more and more focus of the design has been placed on the users' experience. For example, wide viewing angles, high resolution, high screen ratio, etc., are becoming the selling points of the electronic display devices.

BRIEF SUMMARY OF THE DISCLOSURE

In view of the above, the present disclosure provides a display panel and a display device with an improved screen ratio to solve the problems in the field of display technology.

To achieve the above purpose, in one aspect, the present disclosure provides a display panel. The display panel includes: a display area and a non-display area surrounding the display area, the display area including a curved corner, and the non-display area including a corner non-display area adjacent to the curved corner; and a plurality of signal lines, a plurality of signal connection lines, and a plurality of cascaded shift registers, the plurality of cascaded shift registers being electrically connected by associated cascade lines, and each cascaded shift register being connected with a corresponding signal line through an associated signal connection line. In the corner non-display area, a first subset of the associated cascade lines are located on a side of a first subset of the plurality of cascaded shift registers away from the display area, a first portion of the plurality of signal lines are located on a side of the first subset of the associated cascade lines away from the first subset of the plurality of cascaded shift registers, a cascade line of the first subset of the associated cascade lines includes a first extension line and a first cascade connection line at each end of the first extension line, the first cascade connection line connects with the first extension line and a shift register of the first subset of the plurality of cascaded shift registers, wiring directions of the first portion of the plurality of signal lines and wiring directions of extension lines of the first subset of the associated cascade lines are in parallel with an outer edge of the corner non-display area, each shift register of the plurality of cascaded shift registers includes at least one thin film transistor, where channel region directions of thin film transistors in the first subset of the plurality of cascaded shift registers are identical, and a portion of a first signal connection line of a first subset of the plurality of signal connection lines that overlaps a first signal line of the first portion of the plurality of signal lines is perpendicular to the first signal line, and a portion of a second signal connection line of the first subset of the plurality of signal connection lines that overlaps a second extension line of the second subset of the associated cascade lines is perpendicular to the second extension line.

In another aspect, the present disclosure provides a display device. The display device includes a signal-generating component for generating a signal, and a display panel for displaying the signal, where the display panel includes: a display area and a non-display area surrounding the display area, the display area including a curved corner, and the non-display area including a corner non-display area adjacent to the curved corner; and a plurality of signal lines, a plurality of signal connection lines, and a plurality of cascaded shift registers, the plurality of cascaded shift registers being electrically connected by associated cascade lines, and each cascaded shift register being connected with a corresponding signal line through an associated signal connection line. In in the corner non-display area, a first subset of the associated cascade lines are located on a side of a first subset of the plurality of cascaded shift registers away from the display area, a first portion of the plurality of signal lines are located on a side of the first subset of the associated cascade lines away from the first subset of the plurality of cascaded shift registers, a cascade line of the first subset of the associated cascade lines includes a first extension line and a first cascade connection line at each end of the first extension line, the first cascade connection line connects with the first extension line and a shift register of the first subset of the plurality of cascaded shift registers, wiring directions of the first portion of the plurality of signal lines and wiring directions of extension lines of the first subset of the associated cascade lines are in parallel with an outer edge of the corner non-display area, each shift register of the plurality of cascaded shift registers includes at least one thin film transistor, where channel region directions of thin film transistors in the first subset of the plurality of cascaded shift registers are identical, and a portion of a first signal connection line of a first subset of the plurality of signal connection lines that overlaps a first signal line of the first portion of the plurality of signal lines is perpendicular to the first signal line, and a portion of a second signal connection line of the first subset of the plurality of signal connection lines that overlaps a second extension line of the second subset of the associated cascade lines is perpendicular to the second extension line.

Other aspects of the present disclosure can be understood by those skilled in the art in light of the description, the claims, and the drawings of the present disclosure.

BRIEF DESCRIPTION OF THE DRAWINGS

To make the technical solutions in the embodiments of the present disclosure clearer, a brief introduction of the accompanying drawings consistent with descriptions of the embodiments will be provided hereinafter. It should be noted that the following described drawings are merely some embodiments of the present disclosure. Based on the accompanying drawings and without creative efforts, persons of ordinary skill in the art may derive other drawings.

DETAILED DESCRIPTION

Figure 1:
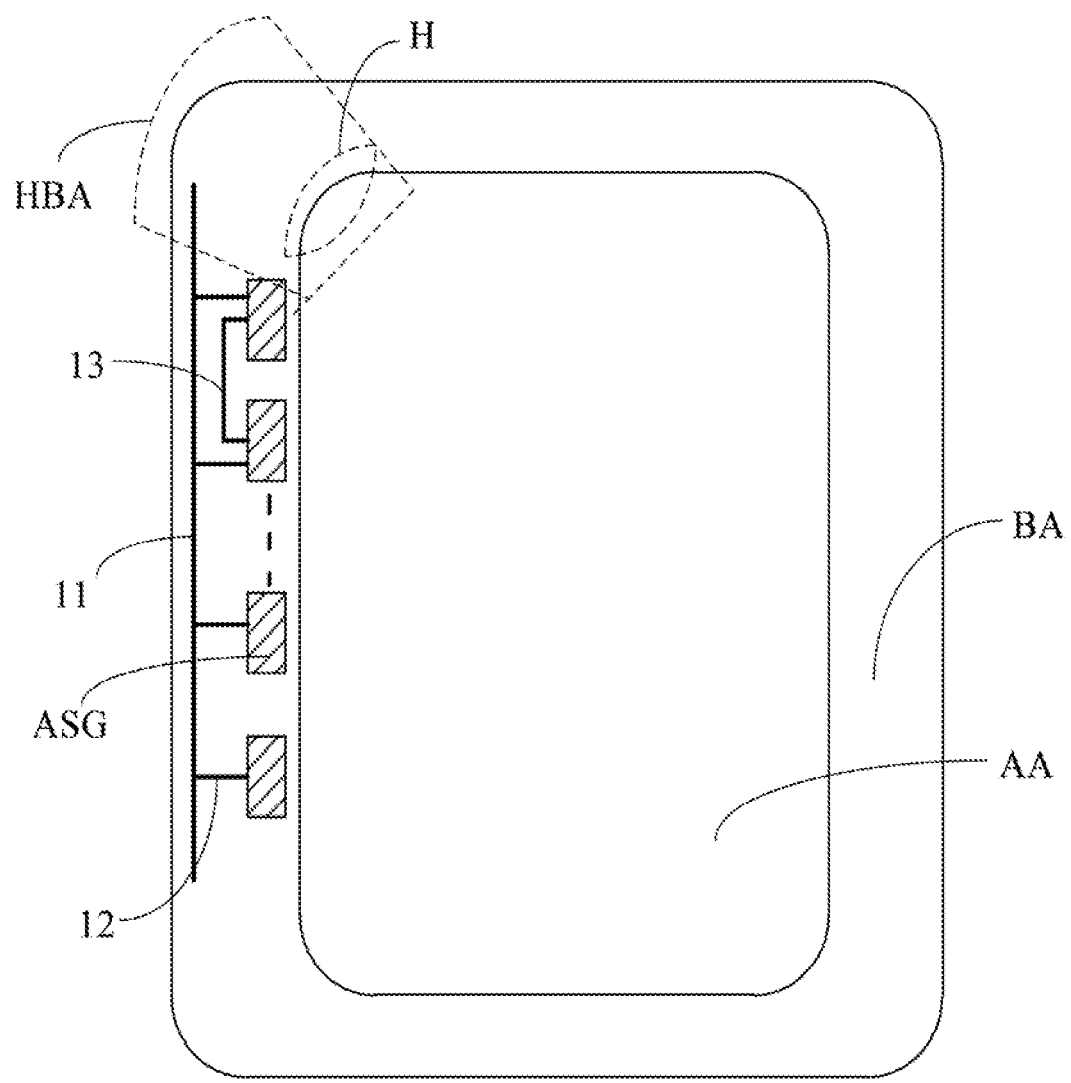
FIG. 1 illustrates a schematic diagram of a sectional view of a display panel consistent with disclosed embodiments.

Description of various exemplary embodiments of the present disclosure will now be made in detail with reference to the accompanying drawings. It should be noted that, unless specifically articulated, the relative arrangements of the components and steps, numerical expressions, and numerical values set forth in the disclosed embodiments are provided by way of examples but not by way of limitation of the scope of the present disclosure.

The description of the following one or more exemplary embodiments is provided merely for illustrative purpose, but not to limit the present disclosure and its application and usage.

In the examples provided and discussed herein, any specific values are merely for illustrative propose, but not for a limitation. Accordingly, different values might be applicable to other examples of the disclosed embodiments.

It should be noted that like reference numerals and letters refer to like parts throughout the following figures. Accordingly, an item defined in one drawing might be not necessarily described again in the subsequent figures.

The present disclosure relates to a display panel and a display device. The display panel includes an array substrate, a color filter substrate, and a liquid crystal layer disposed between the array substrate and the color filter substrate. The array substrate includes a base substrate and thin film transistors, a common electrode, pixel electrodes, gate lines, and data lines, etc., that are formed on the base substrate. A thin film transistor functions as a switching device of sub-pixels in the display panel. The gate of a thin film transistor is connected with a gate line of the display panel, and is connected with a gate scan circuit via the gate line. The source of a thin film transistor is connected with a data line, and is connected with an integrated circuit chip (IC) via the data line. The drain of a thin film transistor is connected with a pixel electrode. Voltage is applied to the pixel electrode through the data line, so that an electric field is formed between the pixel electrode and the common electrode. Liquid crystal molecules of the liquid crystal layer are deflected within the electric field to control whether the light is emitted or not, thereby achieving the display of a display panel.

At present, with the shape requirements in the design of display devices, in the existing display panels, a corner of the display area is usually a non-right-angle corner. This then requires a specific layout of the circuit units and lines in the display panels to ensure their adaptation to the shapes of the non-display areas. The present disclosure provides a display panel that has a specific layout for the circuit units and lines in the non-display area, that can reduce the occupied area in the non-display area, and thus improves the screen ratio.

Figure 2:
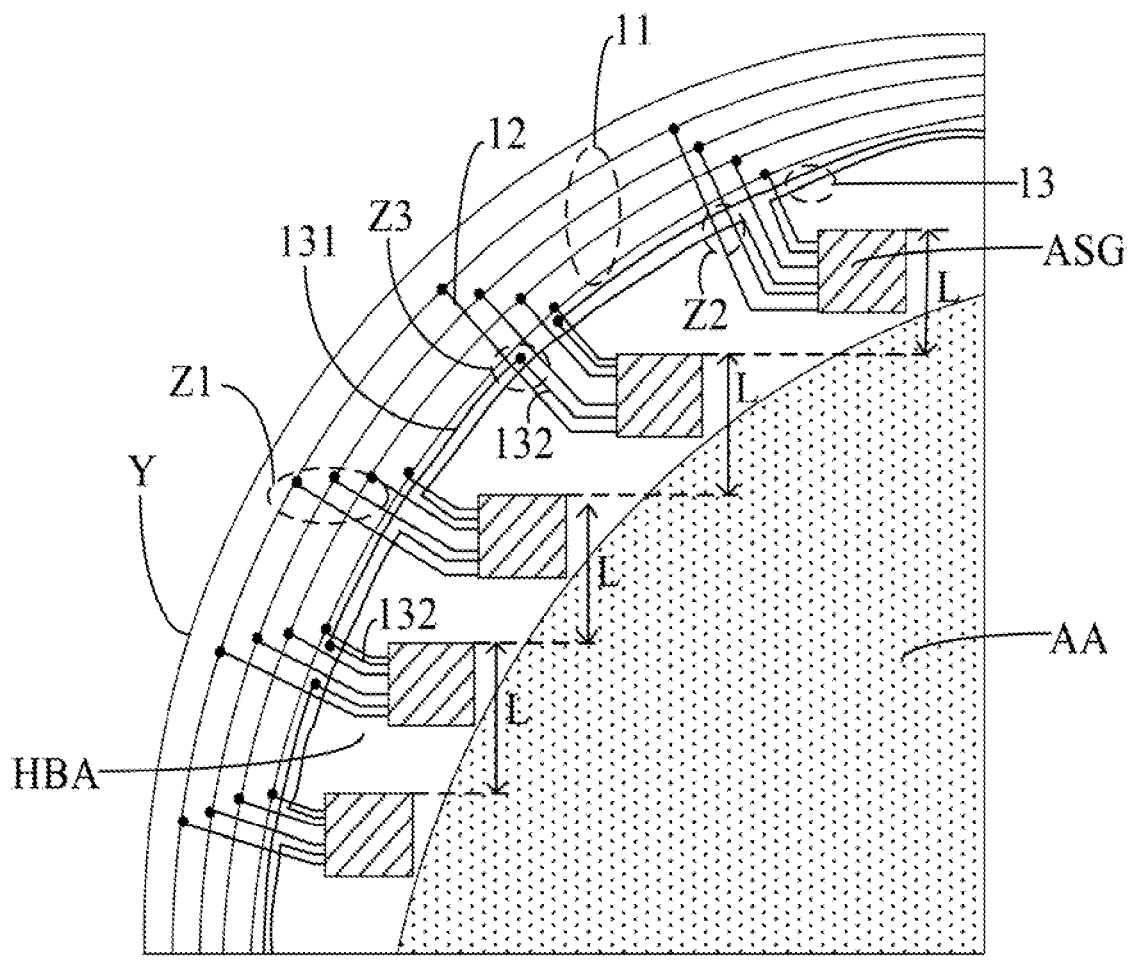
FIG. 2 illustrates a schematic diagram of an enlarged sectional view of a display panel consistent with disclosed embodiments.

FIG. 1 is a schematic diagram of a sectional view of a display panel consistent with disclosed embodiments. FIG. 2 is a schematic diagram of an enlarged sectional view of a display panel consistent with disclosed embodiments.

As shown in FIG. 1, the display panel includes a display area AA and a non-display area BA surrounding the display area AA. The display area AA includes a curved corner H, and the non-display area BA includes a corner non-display area HBA adjacent to the curved corner H. It should be noted that the shape of the display panel in FIG. 1 is merely for illustrative purpose. For example, in optional embodiments, the display area AA of a display panel may have a notch that also has a similar curved corner H as shown in FIG. 1 in the display area AA.

The display panel includes signal line(s) 11, signal connection lines 12, and a plurality of cascaded shift registers ASG. The plurality of cascaded shift registers ASG are electrically connected by cascade lines 13. Each shift register ASG is connected with a corresponding signal line 11 through a signal connection line 12. In order to accomplish the display in the display panel, the display panel includes a plurality of signal lines 11. The plurality of signal lines 11 respectively provide a clock signal, a trigger signal, a high level signal, a low level signal, etc. to the shift registers ASG. The corresponding signal connection lines 12 also include multiple lines. The number of the signal lines 11 and the signal connection lines 12 shown in FIG. 1 is merely for illustrative purpose. In order to implement a signal transfer between the cascaded shift registers ASG, for example, between the n-th stage shift register ASG and the n+1-th stage shift register ASG (where n is a positive integer), there is a need of a cascade line 13 for electrical connection. Only one cascade line 13 is schematically shown in FIG. 1.

Referring to FIG. 2, a curved corner of the display area AA and a corner non-display area HBA are illustrated. In the corner non-display area HBA, the cascade lines 13 are located on the side of the shift registers ASG away from the display area AA, and the signal lines 11 are located on the side of the cascade lines 13 away from the shift registers ASG. A cascade line 13 includes an extension line 131 and two cascade connection lines 132 at the two ends of the extension line 131. A cascade connection line 132 is connected with a shift register ASG and the extension line 131. The directions of both the signal lines 11 and the extension lines 131 are aligned in parallel with the outer edge Y of the corner non-display area HBA. Each shift register ASG includes at least one thin film transistor. The channel regions of the thin film transistors in all of the shift registers ASG have the identical channel direction (not shown in FIG. 2). A portion of a signal connection line 12 that overlaps a signal line 11 is perpendicular to the signal line 11, as indicated by the area Z1. A portion of a signal connection line 12 that overlaps an extension line 131 is perpendicular to the extension line 131, as indicated by the area Z2.

It should be noted that, in order to implement the signal shift function of a shift register, a plurality of thin film transistors may be included in a shift register. A channel region of a thin film transistor is a partial region in the active layer of the thin film transistor, and the source and the drain of a thin film transistor are connected by the channel region. The channel region direction described in the present disclosure refers to the direction from the source to the drain in a channel region. The connection mode of the cascade lines in FIG. 1 is merely for illustrative purpose. Each cascade line is connected with two shift registers. It may be connected with two adjacent shift registers or connected with two shift registers that are not adjacent, as shown in FIG. 2.

The specific connection modes are related to the driving modes of the display panel circuits. In the corner non-display area, the directions of the signal lines and the extension lines are both in parallel with the outer edge of the corner non-display area. The signal lines and the extension lines both extend in a curved format. The statement that a portion of a signal connection line that overlaps a signal line is perpendicular to the signal line actually means that a portion of a signal connection line that overlaps a signal line is perpendicular to the tangent line of the curved signal line. Similarly, the statement that a portion of a signal connection line that overlaps an extension line is perpendicular to the extension line actually means that a portion of a signal connection line that overlaps an extension line is perpendicular to the tangent line of the curved extension line.

The display panel provided by the present disclosure includes a curved corner in the display area. In the corner non-display area adjacent to the curved corner, the cascade lines are aligned on the side of the shift registers away from the display area, and the signal lines are aligned on the side of the cascade lines away from the shift registers. That is, the wirings of the above lines are arranged on the outer side of the shift registers, which leaves enough space for the setting of the shift registers in the corner non-display area. Additionally, the wiring directions of the signal lines and the extension lines of the cascade lines are all in parallel with the outer edge of the corner non-display area. Compared with the design of the staircase wiring in some conventional techniques, the space occupied by the wiring in the present disclosure may be reduced, which facilitates narrowing the frame and increasing the screen ratio. In addition, in the present disclosure, the directions of the channel regions of the thin film transistors in all of the shift registers are identical. This prevents the anisotropy of the exposure during the fabrication process that may cause a change of the width-to-length ratios of the channels of the thin film transistors and thus affect the driving performance of the display panel. Meanwhile, in the present disclosure, the signal lines and the cascade lines are both aligned on the side of the shift registers away from the display area. If the signal lines and the shift registers are connected through the signal connection lines, the signal connection lines then need to insulatedly intersect with some signal lines or extension lines to set up the connection with the shift registers. This may lead to a generation of coupling capacitance on the signal connection lines. By setting the portions of signal connection lines that overlap the signal lines to be perpendicular to the signal lines and the portions of the signal connection lines that overlap the extension lines to be perpendicular to the extension lines, it can be ensured that the areas where the signal connection lines overlap the signal lines and the extension lines be minimized. The coupling capacitance generated on the signal connection lines may then be reduced, thereby facilitating a decrease of power consumption in the display panel.

Further, still referring to FIG. 2, in the corner non-display area HBA, an end of a cascade connection line 132 that is connected with the extension line 131 is perpendicular to the extension line 131, as shown by the area Z3. A cascade line includes two cascade connection lines and one extension line. The cascade line is located on the side of the shift registers away from the display area. When connecting to a shift register, a cascade connection line may insulatedly intersect with sonic extension lines to generate a coupling capacitance. In the display panel of the disclosed embodiment, by setting the ends of cascade connection lines that are connected with extension lines to be perpendicular to the extension lines (that is, perpendicular to the tangent lines of the curved extension lines), it can be ensured that the areas where the cascade connection lines overlap some extension lines be minimized. The coupling capacitance generated on the cascade connection lines may then be reduced, thereby facilitating a further decrease of power consumption in the display panel.

Figure 3:
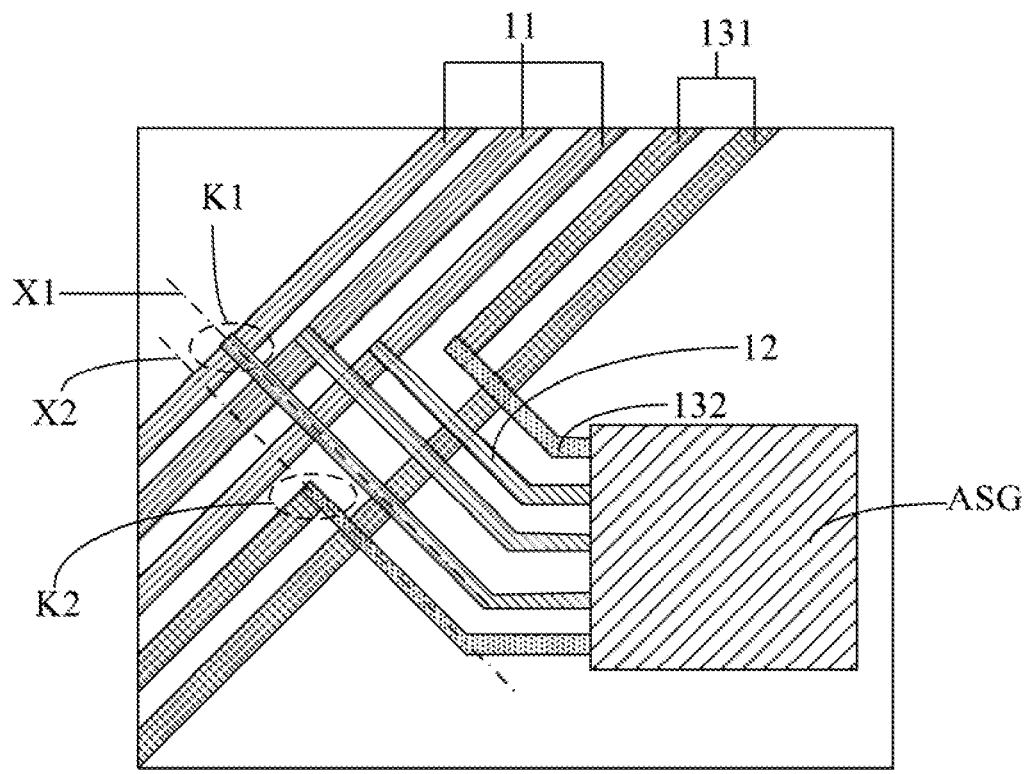
FIG. 3 illustrates a schematic diagram of an enlarged sectional view of a corner non-display area of a display panel consistent with disclosed embodiments.
Figure 4:
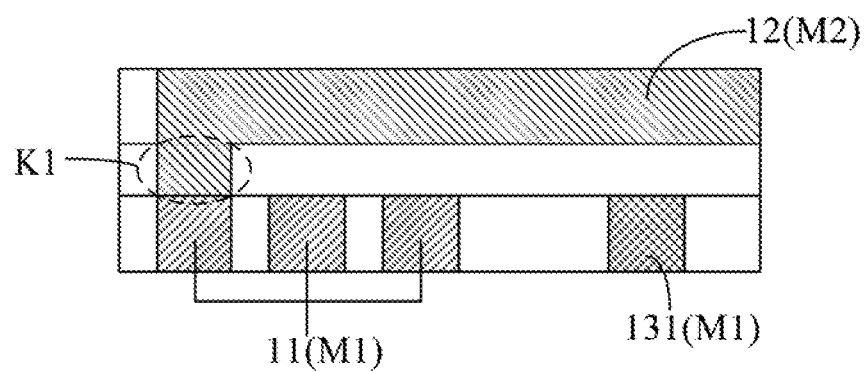
FIG. 4 illustrates a schematic diagram of a cross-sectional view of a tangent line X1 region of FIG. 3 consistent with disclosed embodiments.
Figure 5:
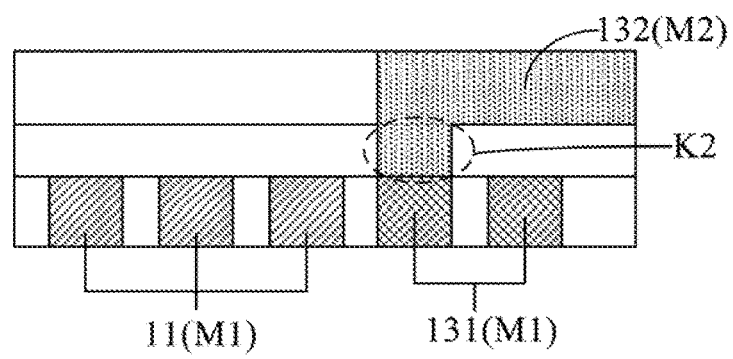
FIG. 5 illustrates a schematic diagram of a cross-sectional view of a tangent line X2 region of FIG. 3 consistent with disclosed embodiments.

Further, FIG. 3 illustrates an enlarged sectional schematic view of a corner non-display area of a display panel consistent with disclosed embodiments. FIG. 4 illustrates a schematic diagram of a cross-sectional view of a tangent line X1 region of FIG. 3 consistent with disclosed embodiments. FIG. 5 is a schematic diagram of a cross-sectional view of a tangent line X2 region of FIG. 3 consistent with disclosed embodiments.

As shown in FIG. 3, in the corner non-display area, if magnified indefinitely, both the signal lines 11 and the extension lines 131 tend to be straight. The shift register ASG is connected with the corresponding signal lines 11 through the signal connection lines 12, and the cascade connection lines 132 are connected with the shift register ASG and the extension lines 131. The signal connection lines 12 are electrically connected with the signal lines 11 through a first via hole K1, and some cascade connection lines 132 are electrically connected with the extension lines 131 through a second via hole K2.

Referring to FIG. 4 and FIG. 5, the display panel provided by the present disclosure includes an array substrate. The array substrate 101 includes a first metal layer M1 and a second metal layer M2. The signal lines 11 and the extension lines 131 are wired in the first metal layer M1, while the signal connection lines 12 and some cascade connection lines 132 are wired in the second metal layer M2. As shown in FIG. 4, the signal connection lines 12 are electrically connected with the signal lines 11 through the first via hole K1. As shown in FIG. 5, some cascade connection lines 132 are electrically connected with the extension lines 131 through the second via hole K2.

Optionally, according to different designs of the cascade driving circuit, some cascade connection lines may also be located in the first metal layer. If that is the case, these cascade connection lines and the extension lines do not need set up a connection through a via hole, but rather directly connect with each other. These cascade connection lines are then connected with the shift registers.

Figure 6:
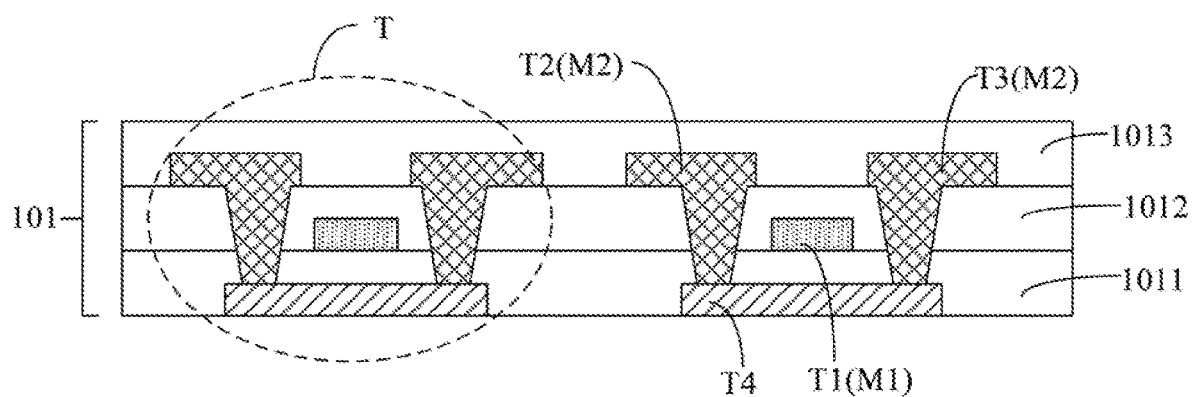
FIG. 6 illustrates a structural diagram of an array substrate film layer of a display panel consistent with disclosed embodiments.

Further, FIG. 6 illustrates a structural diagram of an array substrate film layer of a display panel consistent with disclosed embodiments. As shown in FIG. 6, the array substrate 101 includes a plurality of display switches T (the numbers in the figure are merely for illustrative purpose). The display switches T serve as switching devices for the pixels in the to display panel. A display switch T is a thin film transistor that includes a gate T1, a source T2, a drain T3, and an active layer T4. Only the top gate structure is exemplified in FIG. 6. Optionally, a display switch T may also have a bottom gate structure. The gate T1 of a display switch T is located in the first metal layer M1. The source T2 and the drain T3 of a display switch T are located in the second metal layer M2. In a display panel, the signal lines and the extension lines are fabricated in the same film layer as the gates of the display switches. The signal connection lines and some cascade connection lines are fabricated in the same film layer as the sources and the drains of the display switches.

Optionally, still referring to FIG. 6, a gate insulating layer 1011 is disposed between the gates T1 and the active layers T4. A cross-layer insulating layer 1012 is disposed between a film layer where the gates T1 reside and a film layer where the sources T2 and the drains T3 reside. A passivation layer 1013 is further disposed on top of the sources T2 and the drains T3.

Further, referring back to FIG. 2, in the display panel provided by the present disclosure, in the corner non-display area HBA, the spacing L between each pair of adjacent shift registers ASG is identical along the direction in which the shift registers ASG are aligned. In the disclosed embodiment, the shift registers are evenly aligned in the corner non-display area, which facilitates the rational design and utilization of the space in the corner non-display area, and the achievement of narrow bezels in the corner non-display area.

Figure 7:
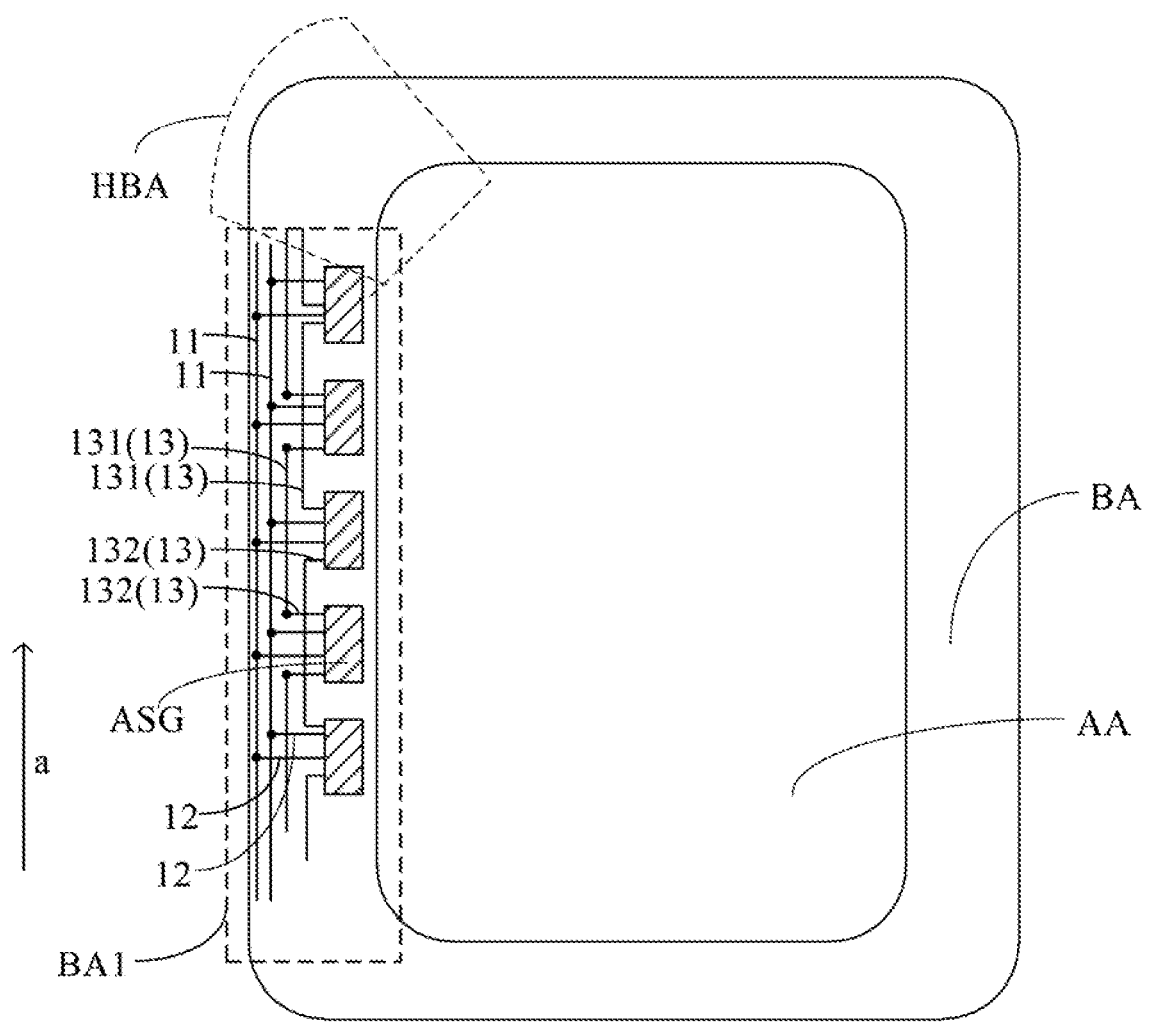
FIG. 7 illustrates a schematic diagram of one implementation of a display panel consistent with disclosed embodiments.

Further, FIG. 7 illustrates a schematic diagram of one implementation of a display panel consistent with disclosed embodiments. As shown in FIG. 7, the non-display area BA further includes a first non-display area BA1 extending along the first direction a. The first non-display area BA1 is adjacent to the corner non-display area HBA. In the first non-display area BA1, the cascade lines 13 are located on the side of the shift registers ASG away from the display area AA, and the signal lines 11 are located on the side of the cascade lines 13 away from the shift registers ASG. The signal lines 11 and the cascade lines 13 are both wired along the direction a. Each shift register ASG is connected with a corresponding signal line 11 through a signal connection line 12. The channel region directions of the thin film transistors in all of the shift registers ASG are identical to the channel region direction of the thin film transistors of the shift registers ASG in the corner non-display area HBA (thin film transistors are not shown). The portions of signal connection lines 12 that overlap signal lines 11 are perpendicular to the signal lines 11. The portions of signal connection lines 12 that overlap extension lines 131 are perpendicular to the extension lines.

In the disclosed embodiment, in the first non-display area, the cascade lines are aligned on the side of the shift registers away from the display area, and the signal lines are aligned on the side of the cascade lines away from the shift registers. That is, the wirings of the above lines are arranged on the outer side of the shift registers. Additionally, the wiring directions of the signal lines and the extension lines of the cascade lines are all in parallel with the outer edge of the first non-display area. In the present disclosure, the directions of the channel regions of the thin film transistors in all of the shift registers are identical to the direction of the channel regions of the thin film transistors in all of the shift registers in the corner non-display area. This prevents the anisotropy of the exposure during the fabrication process that may cause a change of the width-to-length ratios of the channels of the thin film transistors and thus affect the driving performance of die display panel. Meanwhile, in the first non-display area of the present disclosure, by setting the portions of signal connection lines that overlap the signal lines to be perpendicular to the signal lines and the portions of the signal connection lines that overlap the extension lines to be perpendicular to the extension lines, it can be ensured that the areas where the signal connection lines overlap the signal lines and the extension lines be minimized. The coupling capacitance generated on the signal connection lines may then be reduced, thereby facilitating a decrease of power consumption in the display panel.

Still referring to FIG. 7, in the first non-display area BA1, a cascade line 13 includes an extension line 131 and two cascade connection lines 132 at two ends of the extension line 131. A cascade connection line 132 is connected with a shift register ASG and the extension line 131. The end of a cascade connection line 132 that is connected with the extension line 131 is perpendicular to the extension line 131. The cascade lines include cascade connection lines and extension lines, and the cascade lines are located on the side of the shift registers away from the display area. When connecting to the shift registers, the cascade connection lines may insulatedly intersect with some extension lines to generate a coupling capacitance. In the display panel provided by the disclosed embodiment, in the first non-display area, by setting the ends of cascade connection lines that are connected with extension lines to be perpendicular to the extension lines, it can be ensured that the areas where the cascade connection lines overlap some extension lines be minimized. The coupling capacitance generated on the cascade connection lines may then be reduced, thereby further reducing the power consumption in the display panel.

Figure 8:
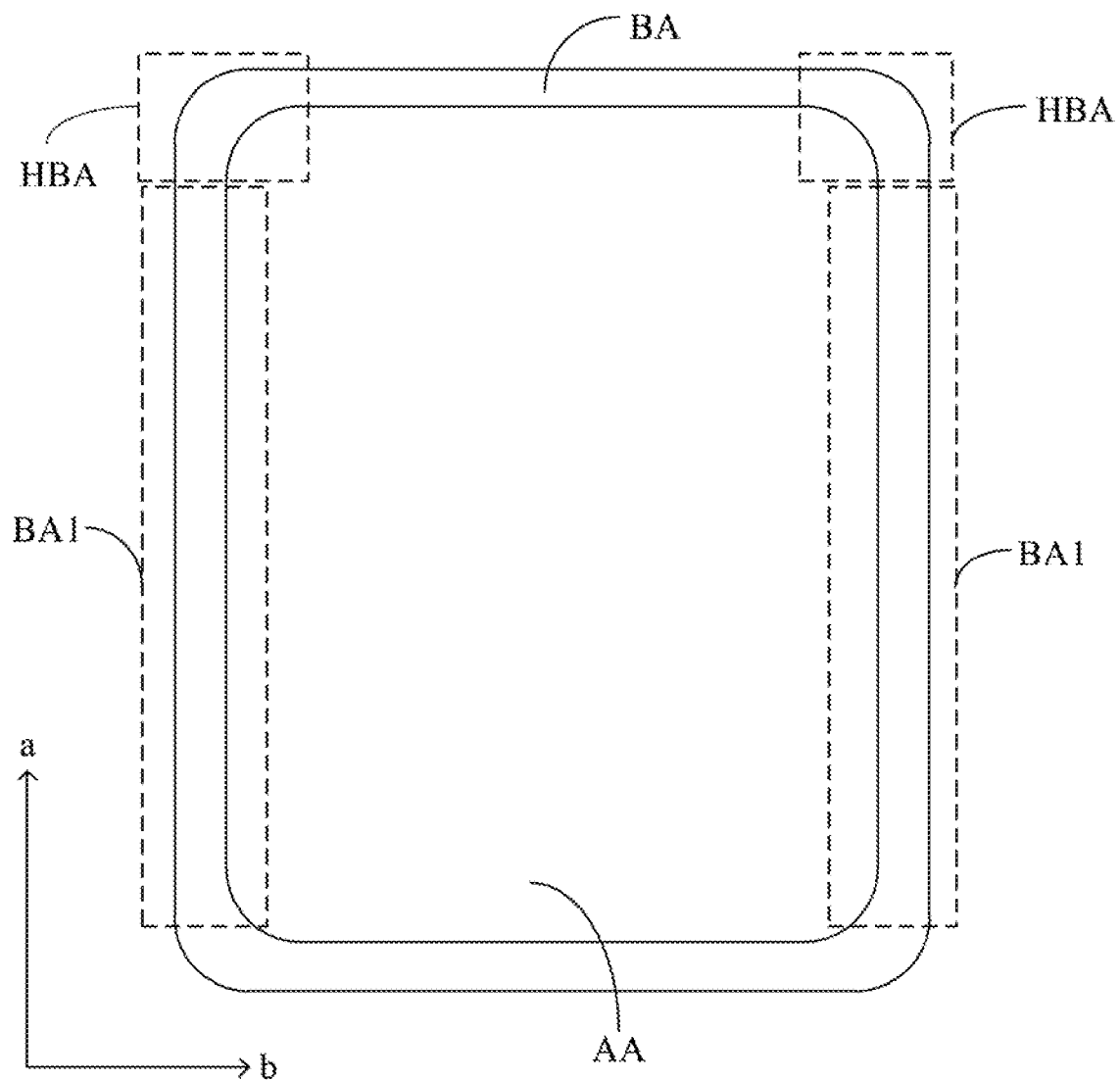
FIG. 8 illustrates a schematic diagram of another implementation of a display panel consistent with disclosed embodiments.

Further, FIG. 8 is a schematic diagram of another implementation of a display panel consistent with disclosed embodiments. As shown in FIG. 8, the non-display area BA includes two corner non-display areas HBA and two first non-display areas BA1. The two corner non-display areas HBA are located on two sides of the display area AA along the second direction b. The two first non-display areas BA1 are also located on two sides of the display area AA along the second direction b. The second direction b is perpendicular to the first direction a. The shift registers and various lines are not shown in the display panel in FIG. 8. In the disclosed embodiment, the shift registers and various lines are distributed across the non-display area on two sides of the display area of the display panel, which reduces the area occupied by the shift registers if they are placed only on one side of the non-display area. This arrangement facilitates the achievement of narrow bezels.

Figure 9:
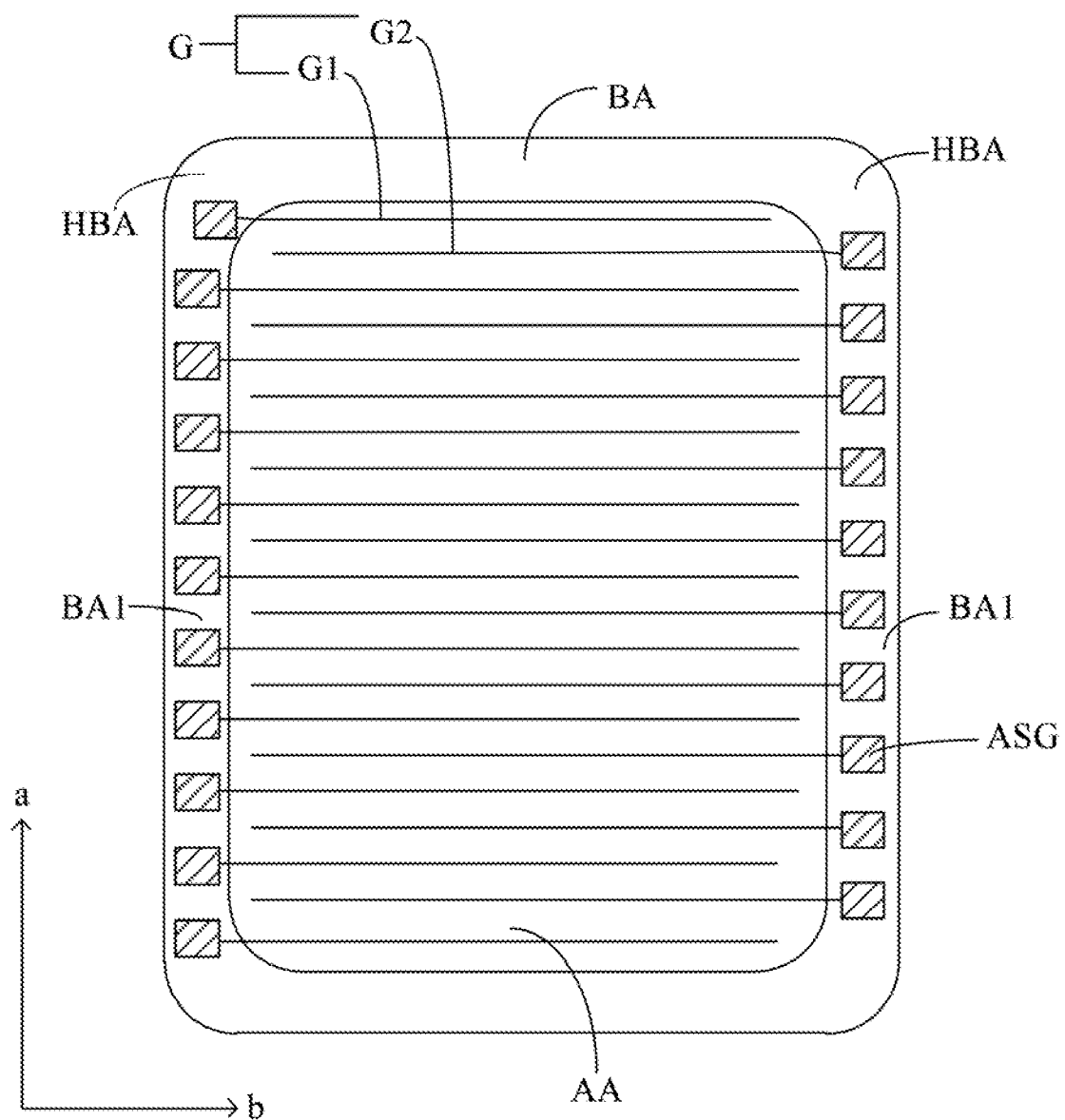
FIG. 9 illustrates a schematic diagram of another implementation of a display panel consistent with disclosed embodiments.

Further, FIG. 9 is a schematic diagram of another implementation of a display panel consistent with disclosed embodiments. As shown in FIG. 9, the display area AA includes a plurality of gate lines G extending along the second direction b. Each gate line G is electronically connected with a shift register ASG. Here, the gate lines G1 in the odd rows are connected with the shift registers ASG in a first non-display area BA1 or a corner non-display area HBA located on the same side of the display area AA. The gate line G2 in the even rows are connected with the shift registers ASG located in a first non-display area BA1 or a corner non-display area HBA located on the other side of the display area AA. In the illustrated embodiment, the gate lines in the odd rows are connected with the shift registers located on one side of the display area, and the gate lines located in the even rows are connected with the shift registers located on the other side of the display area, thereby enabling an interlaced driving of the display panel.

Further, in the display panel provided by the present disclosure, the active layer of a thin film transistor is made of an amorphous silicon semiconductor material or a metal oxide semiconductor material. Amorphous silicon semiconductor materials may be deposited on a variety of large-area substrates, have a low cost of manufacturing, a low turn-off current, and a high switching current ratio. An active layer made of a metal oxide semiconductor material generally has a high mobility, a small sub-threshold swing, and a low off-state current. Optionally, the metal oxide semiconductor material may be indium gallium zinc oxide (IGZO). The indium gallium zinc oxide has a high carrier mobility in it, which may increase the charge and discharge rates of the pixel electrodes applied by the thin film transistors, which improves the response speed of the pixels, thereby achieving a faster refresh rate. A faster response also significantly increases the row scanning speed of pixels and improves display resolution.

Figure 10:
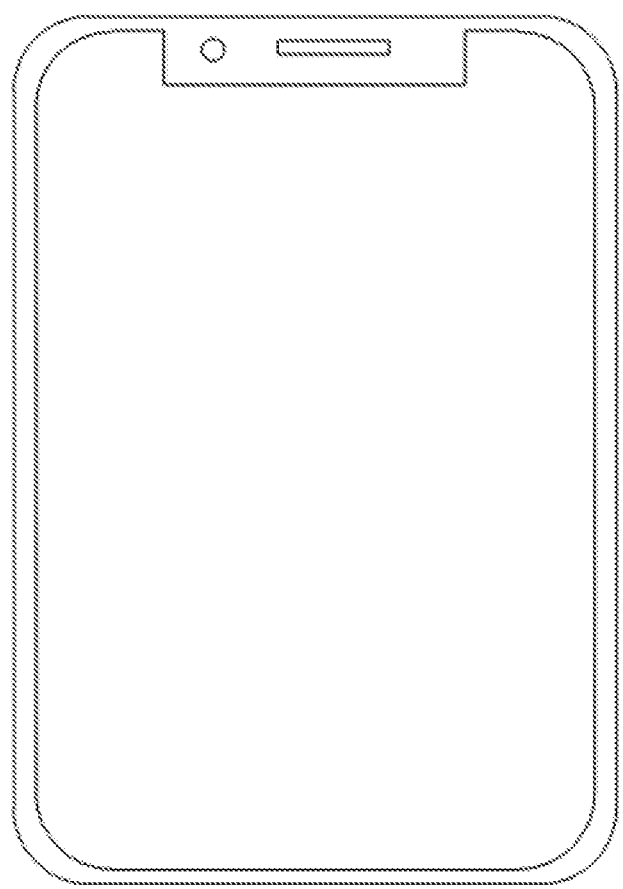
FIG. 10 illustrates a schematic diagram of a display device consistent with disclosed embodiments.

The present disclosure further provides a display device that includes any of the display panels provided by the disclosed embodiments. FIG. 10 illustrates a schematic diagram of a display device consistent with disclosed embodiments. The display device provided by the embodiments of the present disclosure may be any electronic device having a display function, which includes, but is not limited to, a television, a notebook computer, a desktop display, a tablet computer, a digital camera, a mobile phone, a smart wristband, a pair of smart glasses, a vehicle display, a medical equipment, an industrial control equipment, a touch interactive terminal, etc.

As can be seen from the above-disclosed embodiments, the display panel and the display device of the present disclosure achieve the following beneficial effects:

The display panel provided by the present disclosure includes a curved corner in the display area. In the corner non-display area adjacent to the curved corner, the cascade lines are aligned on the side of the shift registers away from the display area, and the signal lines are aligned on the side of the cascade lines away from the shift registers. Additionally, the wiring directions of the signal lines and the extension lines of the cascade lines are all in parallel with the outer edge of the corner non-display area. The space occupied by the wiring may be reduced, which facilitates narrowing the frame and increasing the screen ratio. In addition, in the present disclosure, the directions of the channel regions of the thin film transistors in all of the shift registers are identical. This prevents the anisotropy of the exposure during the fabrication process that may cause a change of the width-to-length ratios of the channels of the thin film transistors and thus affect the driving performance of the display panel. Meanwhile, by setting the portions of signal connection lines that overlap the signal lines to be perpendicular to the signal lines and the portions of the signal connection lines that overlap the extension lines to be perpendicular to the extension lines, it can be ensured that the areas where the signal connection lines overlap the signal lines and the extension lines be minimized. The coupling capacitance generated on the signal connection lines may then be reduced, thereby facilitating a decrease of power consumption in the display panel.

Although the present disclosure has been described as above with reference to the specific embodiments, these embodiments are not to be construed as limiting the present disclosure. Any modifications, equivalent replacements, and improvements made without departing from the spirit and principle of the present disclosure shall fall within the scope of the protection of the present disclosure, which is reflected by the appended claims.

What is claimed:

1. A display panel, comprising:
   a display area and a non-display area surrounding the display area, the display area including a curved corner, and the non-display area including a corner non-display area adjacent to the curved corner; and
   a plurality of signal lines, a plurality of signal connection lines, and a plurality of cascaded shift registers, the plurality of cascaded shift registers being electrically connected by associated cascade lines, and each cascaded shift register being connected with a corresponding signal line through an associated signal connection line, wherein in the corner non-display area:
   a first subset of the associated cascade lines are located on a side of a first subset of the plurality of cascaded shift registers away from the display area, a first portion of the plurality of signal lines are located on a side of the first subset of the associated cascade lines away from the first subset of the plurality of cascaded shift registers, a cascade line of the first subset of the associated cascade lines includes a first extension line and a first cascade connection line at each end of the first extension line, the first cascade connection line connects with the first extension line and a shift register of the first subset of the plurality of cascaded shift registers,
   wiring directions of the first portion of the plurality of signal lines and wiring directions of extension lines of the first subset of the associated cascade lines are in parallel with an outer edge of the corner non-display area,
   each shift register of the plurality of cascaded shift registers includes at least one thin film transistor, wherein channel region directions of thin film transistors in the first subset of the plurality of cascaded shift registers are identical, and
   a portion of a first signal connection line of a first subset of the plurality of signal connection lines that overlaps a first signal line of the first portion of the plurality of signal lines is perpendicular to the first signal line, and a portion of a second signal connection line of the first subset of the plurality of signal connection lines that overlaps a second extension line of the second subset of the associated cascade lines is perpendicular to the second extension line.

2. The display panel according to claim 1, wherein:
   in the corner non-display area, an end of the first cascade connection line that is connected with the first extension line is perpendicular to the first extension line.

3. The display panel according to claim 1, wherein:
   the display panel includes an array substrate, and the array substrate includes a first metal layer and a second metal layer; and
   the plurality of signal lines and extension lines of the associated cascade lines are wired in the first metal layer, the plurality of signal connection lines and a subset of cascade connection lines of the associated cascade lines are wired in the second metal layer, and the plurality of signal connection lines are electrically connected with the plurality of signal lines through a first via hole, and the subset of cascade connection lines of the associated cascade lines are electrically connected with the extension lines of the associated cascade lines through a second via hole.

4. The display panel according to claim 3, wherein:
the array substrate includes a plurality of display switches, wherein a display switch is a thin film transistor, a gate of the display switch is located in the first metal layer, and a source and a drain of the display switch are located in the second metal layer.

5. The display panel according to claim 1, wherein:
in the corner non-display area, a spacing between each pair of adjacent shift registers is identical along a direction in which the first subset of the plurality of cascaded shift registers are aligned.

6. The display panel according to claim 1, wherein:
the non-display area further includes a first non-display area extending along a first direction, and the first non-display area is adjacent to the corner non-display area, wherein in the first non-display area:
a second subset of the associated cascade lines are located on a side of a second subset of the plurality of cascaded shift registers away from the display area, a second portion of the plurality of signal lines are located on a side of the second subset of the associated cascade lines away from the second subset of the plurality of cascaded shift registers, and the second portion of the plurality of signal lines and extension lines of the second subset of the associated cascade lines are wired along the first direction,
channel region directions of thin film transistors in the second subset of the plurality of cascaded shift registers in the first non-display area are identical to the channel region directions of the thin film transistors in the first subset of the plurality of cascaded shift registers in the corner non-display area, and
a portion of a third signal connection line of a second subset of the plurality of signal connection lines that overlaps a third signal line of the second portion of the plurality of signal lines is perpendicular to the third signal line, and a portion of a fourth signal connection line of the second subset of the plurality of signal connection lines that overlaps a fourth extension line of the second subset of the associated cascade lines is perpendicular to the fourth extension line.

7. The display panel according to claim 6, wherein;
in the first non-display area, a cascade line of the second subset of the associated cascade lines includes a fifth extension line and a fifth cascade connection line at each end of the fifth extension line, and the fifth cascade connection line is connected with the fifth extension line and a shift register of the second subset of the plurality of cascaded shift registers, and an end of the fifth cascade connection line that is connected with the fifth extension line is perpendicular to the fifth extension line.

8. The display panel according to claim 6, wherein:
the non-display area includes two corner non-display areas and two first non-display areas; and
the two corner non-display areas are located on two sides of the display area along a second direction, the two first non-display areas are located on the two sides of the display area along the second direction, and the second direction is perpendicular to the first direction.

9. The display panel according to claim 8, wherein:
the display area includes a plurality of gate lines extending along the second direction, and each of the plurality of gate lines is electrically connected with a shift register of the plurality of cascaded shift registers; and gate lines located in odd rows are connected with a first subgroup of the plurality of cascaded shift registers located in a first non-display area or a corner non-display area on one side of the display area, and gate lines located in even rows are connected with a second subgroup of the plurality of cascaded shift registers located in a first non-display area or a corner non-display area on another side of the display area.

10. The display panel according, to claim 1, wherein:
an active layer of a thin film transistor is made of one of an amorphous silicon semiconductor material and a metal oxide semiconductor material.

11. A display device, comprising:
a signal-generating component for generating a signal; and
a display panel for displaying the signal, wherein the display panel includes:
a display area and a non-display area surrounding the display area, the display area including a curved corner, and the non-display area including a corner non-display area adjacent to the curved corner; and
a plurality of signal lines, a plurality of signal connection lines, and a plurality of cascaded shift registers, the plurality of cascaded shift registers being electrically connected by associated cascade lines, and each cascaded shift register being connected with a corresponding signal line through an associated signal connection line, wherein in the corner non-display area:
a first subset of the associated cascade lines are located on a side of a first subset of the plurality of cascaded shift registers away from the display area, a first portion of the plurality of signal lines are located on a side of the first subset of the associated cascade lines away from the first subset of the plurality of cascaded shift registers, a cascade line of the first subset of the associated cascade lines includes a first extension line and a first cascade connection line at each end of the first extension line, the first cascade connection line connects with the first extension line and a shift register of the first subset of the plurality of cascaded shift registers,
wiring directions of the first portion of the plurality of signal lines and wiring directions of extension lines of the first subset of the associated cascade lines are in parallel with an outer edge of the corner non-display area,
each shift register of the plurality of cascaded shift registers includes at least one thin film transistor, wherein channel region directions of thin film transistors in the first subset of the plurality of cascaded shift registers are identical, and
a portion of a first signal connection line of a first subset of the plurality of signal connection lines that overlaps a first signal line of the first portion of the plurality of signal lines is perpendicular to the first signal line, and a portion of a second signal connection line of the first subset of the plurality of signal connection lines that overlaps a second extension line of the second subset of the associated cascade lines is perpendicular to the second extension line.

12. The display device according to claim 11, wherein:
in the corner non-display area, an end of the first cascade connection line that is connected with the first extension line is perpendicular to the first extension line.

13. The display device according to claim 11, wherein:
the display panel includes an array substrate, and the array substrate includes a first metal layer and a second metal layer; and the plurality of signal lines and extension lines of the associated cascade lines are wired in the first metal layer, the plurality of signal connection lines and a subset of cascade connection lines of the associated cascade lines are wired in the second metal layer, and the plurality of signal connection lines are electrically connected with the plurality of signal lines through a first via hole, and the subset of cascade connection lines of the associated cascade lines are electrically connected with the extension lines of the associated cascade lines through a second via hole.

14. The display device according to claim 13, wherein:
the array substrate includes a plurality of display switches, wherein a display switch is a thin film transistor, a gate of the display switch is located in the first metal layer, and a source and a drain of the display switch are located in the second metal layer.

\* \* \* \* \*